United States Patent [19]

Iida et al.

[11] 4,213,086
[45] Jul. 15, 1980

[54] SELECTOR DEVICE FOR THE DETERMINATION OF THE TYPE OF ELECTROCONDUCTIVITY IN SEMICONDUCTOR WAFERS

[75] Inventors: Yoshiya Iida, Annaka; Shoichiro Ohga, Higashikurume, both of Japan

[73] Assignee: Shin-Etsu Handotal Co., Ltd., Tokyo, Japan

[21] Appl. No.: 922,284

[22] Filed: Jul. 6, 1978

[30] Foreign Application Priority Data

Jul. 8, 1977 [JP] Japan ............................... 52-81036

[51] Int. Cl.$^2$ ...................... G01R 27/00; G01R 31/26
[52] U.S. Cl. ....................................... 324/62; 324/64; 324/158 R
[58] Field of Search .......... 324/64, 62, 65 CP, 158 P, 324/158 T, 158 D, 158 R

[56] References Cited

FOREIGN PATENT DOCUMENTS 423068 9/1974 U.S.S.R. .................................. 324/64

OTHER PUBLICATIONS

Eden et al., Semiautomatic Hall Effect Measurements System, The Review of Scientific Instruments, Jul. 1970, pp. 1030–1033.

Dauphinee et al., Apparatus for Measuring Resistivity & Hall Coefficient of Semiconductors, The Review of Scientific Instruments, Jul. 1953, pp. 660–662.

Zhilinskas et al., Measurement of the Hall Effect in High-Ohm Samples, Instrum. & Exp. Tech. (USA), May–Jun. 1972, pp. 901–904.

*Primary Examiner*—Ernest F. Karlsen
*Attorney, Agent, or Firm*—Hopgood, Calimafde, Kalil, Blaustein & Lieberman

[57] ABSTRACT

A novel selector device for the determination of the conductivity-type in a semiconductor wafer utilizes the determination of the polarity of the electromotive force produced in the wafer by the Hall effect. The device comprises two pairs of probes in diagonal arrangement for supplying an electric current through the wafer and for detecting the electromotive force, respectively, by contacting the wafer surface, and a pair of permanent magnets positioned oppositely with the wafer in between to produce a magnetic field perpendicular to the wafer. One of the permanent magnets is located within the circumference determined by the probes.

1 Claim, 3 Drawing Figures

SELECTOR DEVICE FOR THE DETERMINATION OF THE TYPE OF ELECTROCONDUCTIVITY IN SEMICONDUCTOR WAFERS

BACKGROUND OF THE INVENTION

The present invention relates to a selector device for a semiconductor wafer with respect to the type of electroconductivity of the wafer, which utilizes the dependency of the polarity of the electromotive force produced in the wafer by the wafer's Hall effect on the conductivity type.

Most of the prior art selector devices for this purpose utilize either the (a) the point-contact rectifier probe method or (b) the thermoelectromotive force method by the use of probes. The results obtained by the use of the former method are frequently from erroneous, especially, for semiconductor wafers with relatively low resistivity. The use of the latter method is characterized by a lengthy time required to perform the measurement, especially when used with semiconductor wafers with relatively high resistivity.

Thus, it is a general practice in the semiconductor technology to use the selector devices of either the former type or the latter type in accordance with the resistivity of the semiconductor wafer undergoing measurement. It is, of course, very troublesome in routine measurement work to switch the selector devices as the resistivity range of the wafer under measurement differs from one wafer to another, leading, consequently, to frequent errors in the determination of the type of surface electroconductivity, which is a problem that is common for both types of devices.

An alternative method for the determination of the conductivity type in a semiconductor wafer material which utilizes the principle that the polarity of the electromotive force produced in a semiconductor wafer by the Hall effect depends upon the type, i.e. n type or p type, of the electroconductivity of the wafer. Although this method has some advantages in that the conductivity type of the semiconductor wafer can be determined reliably regardless of the surface conditions and resistivity of the wafers, it is very difficult to design a practical and reliable selector device utilizing this principle due to the necessity of strong magnetic fields to produce a sufficient electromotive force by the Hall effect, which can be achieved only by the use of a large electromagnet. Further, even with a very large and strong electromagnet, the Hall effect method frequently gives erroneous results in the determination of the conductivity type for a reason that is not well understood.

SUMMARY OF THE INVENTION

The object of the present invention is therefore to provided an improved selector device for the determination of the conductivity type in a semiconductor wafer which is capable of convenient and rapid measurements with high reliability.

The selector device of the present invention comprises two pairs of probes diagonally arranged to be contacted with the surface of the semiconductor wafer under measurement. One pair of probes serves to supply an electric current through the wafer and the other pair of probes detects the electromotive force produced in the wafer by the Hall effect. A pair of permanent magnets opposed to each other have a gap in which the semiconductor wafer is placed when it is under measurement. One of the magnets is positioned within the circumference determined by the probes.

DETAILED DESCRIPTION OF THE PREFERRED EMBODIMENTS

Figure 1:
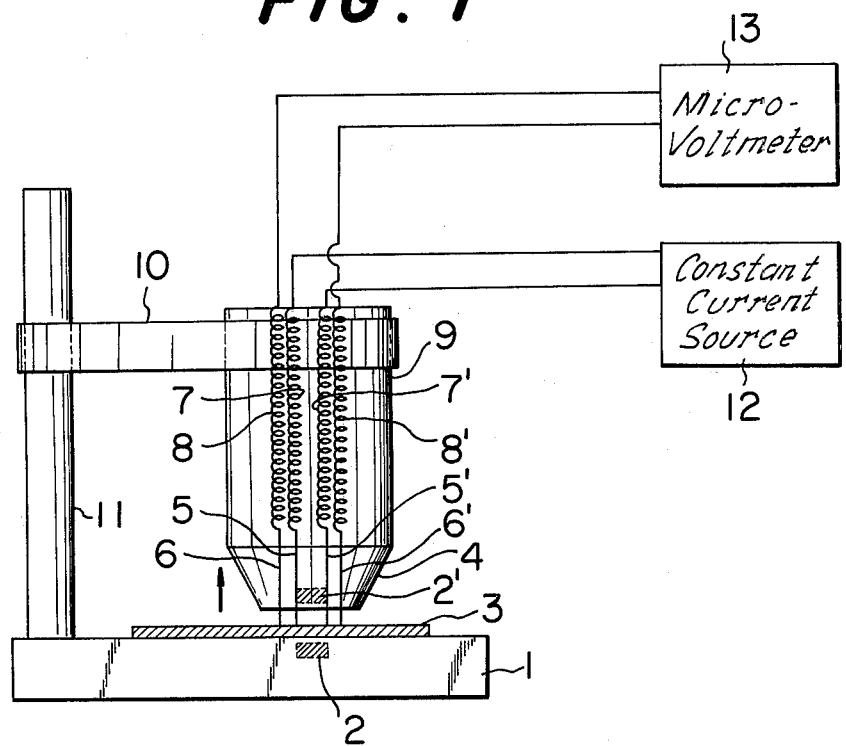
FIG. 1 is a schematic illustration of a selector device showing the principles of the present invention.
Figure 2:
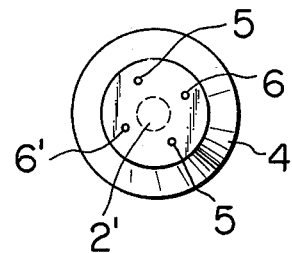
FIG. 2 is an underside view of the selector device illustrated in FIG. 1 showing the arrangement of the upper magnet and two pairs of the probes held in the probe holder.

The selector device of the present invention, as illustrated schematically in FIG. 1, includes a wafer stage 1 made of an electrically insulating material such as an acrylic resin at least in the part on which a semiconductor wafer 3 to be measured is mounted. Two pairs of probes 5, 5' and 6, 6' are provided above the wafer stage 1 in diagonal arrangement, as shown in FIG. 2 as viewed from the underside, of which one pair of the probes 5, 5' supplies an electric current through the wafer 3 and the other pair of the probes 6, 6' detects the electromotive force produced in the wafer by the Hall effect. The probes 5, 5' and 6, 6' are held by a probe holder 4 made of an electrically insulating material such as an acrylic resin.

Within the wafer stage 1 and the probe holder 4 are respectively embedded a pair of permanent magnets 2, 2' in opposed positions. Opposite poles of magnets 2, 2' face each other; for example, the N pole of magnet 2 is opposed to the S pole of the magnet 2' and vice versa. Thus the lines of magnetic force in the magnetic field produced by the pair of the permanent magnets run in a direction substantially perpendicular to the wafer surface. Any kind of permanent magnet may be used for this purpose, but permanent magnets of a cobalt-rare earth alloy, e.g. a Rarenet magnet (trademark by Shin-Etsu Chemical Co., Ltd., Japan) are particularly suitable for this purpose owing to the high magnetic strength and the compactness of the material.

The probe holder 4 is mounted under a shielding box 9, inside of which lead wires 7, 7' and 8, 8' run to be connected to the probes 5, 5' and 6, 6' respectively, for supplying the electric current or for taking out the signals of the electromotive force produced by the Hall effect. A box holder 10 of a shielding box 9 is slidable up and down along a prop 11 whereby the probes 5, 5' and 6, 6' may also be moved together up and down to facilitate the mounting and dismounting of the wafer onto or from the wafer stage 1 and to effect the contacting of the probes to the wafer surface. A constant current source 12 and a microvoltmeter 13 are respectively connected electrically to the probes 5, 5' and 6, 6' through the lead wires 7, 7' and 8, 8'.

As shown in FIG. 2, the upper permanent magnet 2' is embedded in the probe holder 4, and the pairs of the probes 5, 5' and 6, 6' are in a diagonal arrangement. It is desirable that the angle between the lines formed by connecting the individual pairs of the probes be as close as possible to a right angle. It is necessary that at least the upper permanent magnet 2' have a dimension such that the magnet does not extend beyond of the circumference determined by the probes. In particular, the magnet is advantageously confined within the circle (when the distances between probes 5-5' and 6-6' are equal) or the ellipse (when the distances 5-5' and 6-6' differ from each other,) which is inscribed to the square or rhombus having corners at the contact points of the four probes to the wafer surface. The desirability of this design constraint is based on the inventors' discovery that errors in the determination of the conductivity type of a semiconductor device by the Hall effect method increase when the contact points between the probes and the wafer surface are in a strong magnetic field probably due to the adverse effect of the magnetic field on the ohmic contact between the probes and the wafer surface. In this connection, the gap between the permanent magnets 2 and 2' should be as small as possible in order not only to increase the magnetic field in the semiconductor wafer under measurement but also to decrease the magnetic field in the contact points between the probes and the wafer surface.

Figure 3:
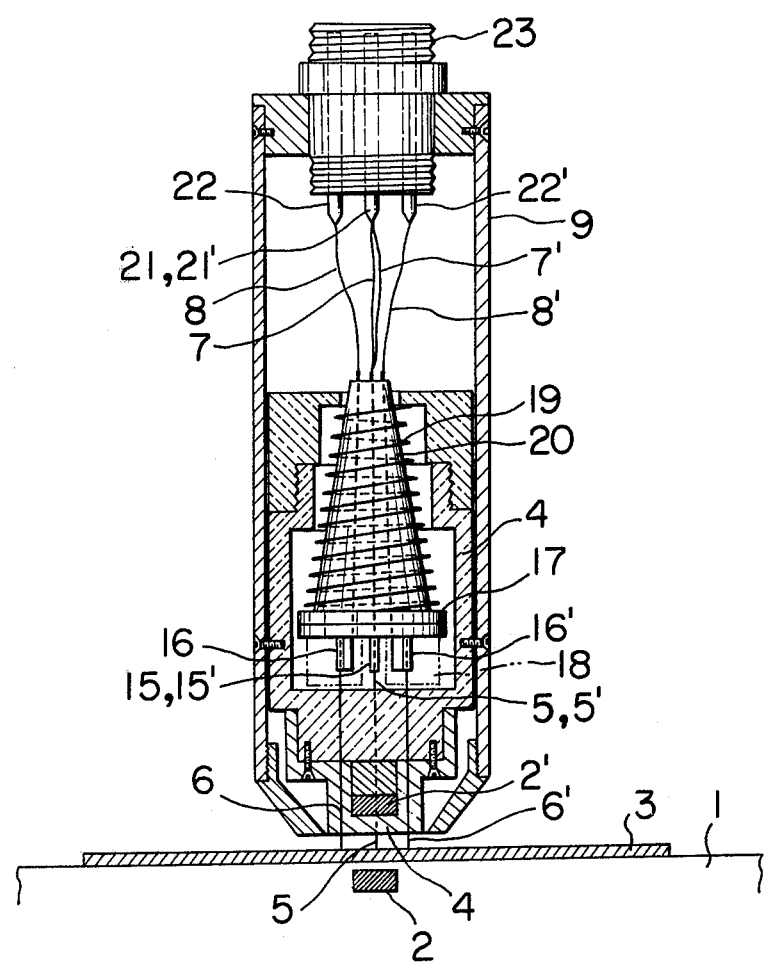
FIG. 3 is a cross-sectional view of a selector device according to a preferred embodiment of the invention.

A determination of the conductivity type of a semiconductor wafer by selector device of the invention is performed by mounting the semiconductor wafer on the wafer stage 1 and then bringing the probes 5, 5' and 6, 6' into contact with the wafer surface by lowering the shielding box 9 along the prop 11 followed by the closing of the electric circuit to supply an electric current through the wafer by the probes 5, 5', whereby the electromotive force produced in the wafer by the Hall effect can be detected in the microvoltmeter 13 through the probes 6, 6'. When the direction of the electric current supplied by the probes 5, 5' is reversed, the polarity of the electromotive force produced by the Hall effect is also reversed leading to a further reliable determination of the conductivity type in the semiconductor wafer. FIG. 3 is a cross sectional view of the main part of a selector device according to as a preferred embodiment of the present invention, in which the wafer stage 1 is made of polymethylmethacrylate resin having a permanent magnet of 5 mm in diameter and 3 mm in thickness embedded close to the upper surface thereof. The permanent magnet is a rare earth-cobalt magnet available under the trademark Rarenet B (product of Shin-Etsu Chemical Co., Ltd., Japan) having a $(BH)_{max}$ value of about 11 megagauss-oersteds. In direct facing to the permanent magnet 2, a second permanent magnet 2' is located and mounted in the probe holder 4 above the first permanent magnet 2. The second permanent magnet 2' is preferably of the same Rarenet B with the same dimensions as the first magnet 2 and the magnetic field between the magnets 2 and 2' is about 2,400 to 3,000 oersteds depending on the distance between them.

Surrounding the second permanent magnet 2', four probes 5,5' and 6,6' penetrate the holes in the probe holder 4 and are capable of free up and down sliding movement relative to the probe holder 4. The probes are in a diagonal arrangement with the distances between the probes 5 and 5' and the probes 6 and 6' each being about 7 mm. The probes 5 and 5' supply electric current through the semiconductor wafer 3 mounted on the wafer stage 1, and the probes 6 and 6' detect the electromotive force produced by the Hall effect in the wafer 3.

The probes 5,5' and 6,6' are respectively inserted into sleeves 15,15' and 16, 16', which are fixed to a probe head 17 at their upper ends and are interchangeable with another set of probes according to need. The sleeves 15, 15' and 16, 16' are separated from each other by a set of spacers 18 to ensure their relative positions.

The probe holder 4 is fixed to the shielding box 9 and a conically shaped coiled spring 19 is provided between the probe head 17 and the upper end of the probe holder 4 exert downward pressure to the probe head 17. Within the conical coiled spring 19, a conical core 20 is provided to involve the lead wires 7, 7' and 8, 8' connected to their respective sleeves 15, 15' and 16, 16' at their lower ends. The upper ends of the lead wires 7, 7' and 8, 8' and respectively connected to lead pins 21, 21' and 22, 22', which are fitted to a socket 23.

By this arrangement of the probe holder 4 and the coiled spring 19 together with the flexibility of the lead wires 7, 7' and 8, 8', the contacting pressure between the points of the probes 5, 5' and 6, 6' and the semiconductor wafer 3 is always controlled adequately regardless of the thickness of the wafer 3.

With the above described selector device of the invention, an almost 100 percent reliability was obtained with an electric current of 0.1 to 10 mA between the probes 5 and 5' for the determination of the conductivity type of a silicon semiconductor wafer when the surface of the wafer is lapped or sand-blasted in a single measurement for each wafer and almost the same results were obtained by confirmatory measurements repeated with the reverse polarity of the electric current between the probes 5 and 5' even when the surface of the wafers was deep-etched or highly polished.

As is described above in detail, the selector device of the present invention is very useful in semiconductor technology owing to its compactness with small sized permanent magnets as well as to the convenience and rapidity in the measurement for the determination of the conductivity type of semiconductor wafer materials.

What is claimed is:

1. A selector device for the determination of the type of electroconductivity in a semiconductor wafer utilizing the polarity of the electromotive force produced in the semiconductor wafer by the Hall effect, said device comprising first and second pairs of probes in a diagonal arrangement to be contacted with the surface of the semiconductor wafer under measurement, one of said pairs of probes supplying an electric current through the wafer, and the other of said pairs of probes detecting the electromotive force produced in the wafer by the Hall effect, and a pair of permanent magnets opposed to each other with a gap in which the semiconductor wafer to be measured is placed when under measurement, one of said permanent magnets being positioned within the circumference determined by said probes, wherein said one of said permanent magnets positioned within the circumference determined by said probes has dimensions such as to be confined within the circle or ellipse inscribed to a square or rhombus having corners at the contact points between said probes and the surface of the semiconductor wafer under measurement.

* * * * *